United States Patent
Peng et al.

(10) Patent No.: US 9,177,918 B2
(45) Date of Patent: Nov. 3, 2015

(54) APPARATUS AND METHODS FOR LOW K DIELECTRIC LAYERS

(71) Applicant: Taiwan Semiconductor Manufacturing Company, Ltd., Hsin-Chu (TW)

(72) Inventors: Yu-Yun Peng, Hsin-Chu (TW); Keng-Chu Lin, Ping-Tung (TW); Joung-Wei Liou, Zhudong (TW); Hui-Chun Yang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/523,707

(22) Filed: Oct. 24, 2014

(65) Prior Publication Data
US 2015/0041964 A1     Feb. 12, 2015

Related U.S. Application Data

(63) Continuation of application No. 13/234,946, filed on Sep. 16, 2011, now Pat. No. 8,889,567.

(51) Int. Cl.
*H01L 23/532* (2006.01)
*H01L 23/00* (2006.01)
(Continued)

(52) U.S. Cl.
CPC ......... *H01L 23/5329* (2013.01); *C23C 16/401* (2013.01); *C23C 16/52* (2013.01);
(Continued)

(58) Field of Classification Search
CPC . H01L 21/768; H01L 21/316; H01L 21/3105; H01L 21/02; H01L 23/532; H01L 23/00; H01L 23/5329; H01L 23/562

USPC ......... 257/374, 637, 751, 752; 438/400, 786, 438/594
See application file for complete search history.

(56) References Cited

U.S. PATENT DOCUMENTS 6,147,012 A   11/2000   Sukharev et al.
7,112,615 B2   9/2006   Gleason et al.
(Continued)

OTHER PUBLICATIONS

Kim, H.J., et al., "Characterization of Low-Dielectric-Constant SiOC Thin Films Deposited by PECVD for Interlayer Dielectrics of Multilevel Interconnection," Elsevier, Surface & Coatings Technology 171 (2003), pp. 39-45.
(Continued)

*Primary Examiner* — Sheng Zhu
(74) *Attorney, Agent, or Firm* — Slater & Matsil, L.L.P.

(57) ABSTRACT

Methods and apparatus for a low k dielectric layer of porous SiCOH. A method includes placing a semiconductor substrate into a vapor deposition chamber; introducing reactive gases into the vapor deposition chamber to form a dielectric film comprising SiCOH and a decomposable porogen; depositing the dielectric film to have a ratio of Si—CH$_3$ to SiO$_{network}$ bonds of less than or equal to 0.25; and performing a cure for a cure time to remove substantially all of the porogen from the dielectric film. In one embodiment the porogen comprises a cyclic hydrocarbon. The porogen may be UV curable. In embodiments, different lowered Si—CH$_3$ to SiO$_{network}$ ratios for the deposition of the dielectric film are disclosed. An apparatus of a semiconductor device including the low k dielectric layers is disclosed.

20 Claims, 6 Drawing Sheets

(51) Int. Cl.
  *H01L 21/02* (2006.01)
  *H01L 21/3105* (2006.01)
  *C23C 16/40* (2006.01)
  *C23C 16/52* (2006.01)
  *C23C 16/56* (2006.01)
  *H01L 21/768* (2006.01)

(52) U.S. Cl.
  CPC ......... *C23C 16/56* (2013.01); *H01L 21/02126* (2013.01); *H01L 21/02203* (2013.01); *H01L 21/02274* (2013.01); *H01L 21/02348* (2013.01); *H01L 21/31058* (2013.01); *H01L 21/7682* (2013.01); *H01L 23/562* (2013.01); *H01L 2221/1047* (2013.01)

(56) References Cited

U.S. PATENT DOCUMENTS

| | | | | |
|---|---|---|---|---|
| 8,889,567 B2* | 11/2014 | Peng et al. | | 438/786 |
| 2004/0241463 A1* | 12/2004 | Vincent et al. | | 428/447 |
| 2006/0078676 A1 | 4/2006 | Lukas et al. | | |
| 2006/0202339 A1 | 9/2006 | Michaelson et al. | | |
| 2008/0265381 A1 | 10/2008 | Afzali-Ardakani et al. | | |
| 2009/0061649 A1 | 3/2009 | Gates et al. | | |
| 2009/0079072 A1 | 3/2009 | Mizusawa et al. | | |
| 2009/0181178 A1 | 7/2009 | Edelstein et al. | | |
| 2009/0215282 A1 | 8/2009 | Moore et al. | | |

OTHER PUBLICATIONS

Kim, S-Y, et al., "Characterization of Ultra Low-k SiOC(H) Film Deposited by Plasma-Enhanced Chemical Vapor Deposition (PECVD)," Transactions on Electrical and Electronic Materials, vol. 13, No. 2, pp. 69-72, Apr. 25, 2012.

Klymko, N., "Vibrational Spectroscopy of Ultra-Low-k Dielectric Materials," Future Fab International, Section 8, Issue 17—Metrology Analysis, Oct. 15, 2004, 3 pages.

Matrajt, G., et al., "FTIR Analysis of the Organics in IDPs: Coomparison with the IR Spectra of the Diffuse Interstellar Medium," Astronomy & Astrophysics 433, 2005, pp. 979-995.

O'Neill, M.L., et al., "Impact of Pore Size and Morphology of Porous Organosilicate Glasses on Integrated Circuit Manufacturing," Mater. Res. Soc. Symp. Proc. vol. 914, © 2006, 12 pages.

* cited by examiner

APPARATUS AND METHODS FOR LOW K DIELECTRIC LAYERS

PRIORITY CLAIM AND CROSS-REFERENCE

The present application is a continuation of U.S. application Ser. No. 13/234,946, entitled "Apparatus and Methods for Low K Dielectric Layers," filed on Sep. 16, 2011, which is incorporated herein by reference.

BACKGROUND

A common requirement for semiconductor processing and the resulting devices produced by the processes is an inter-level dielectric ("ILD") or intermetal dielectric "(IMD"). These layers are disposed between vertically stacked layers containing metal conductors. In current advanced semiconductor processes, the conductors are formed in damascene processes. During processing, an IMD layer is formed in a deposition stage. Anisotropic etching is used to define trenches or vias in the IMD. Metal is formed within the trenches and vias using damascene processes. A particular metal layer is completed by a chemical mechanical polish ("CMP") process to remove the excess conductor material and form conductors contained in trenches within the IMD. Subsequent IMD layers are formed and complex interconnections and wiring using multiple levels of metallization may be completed by repeating these steps.

Wet processing is used to complete the IMD layers. If the IMD layer is not of sufficient mechanical strength, damage may occur to the IMD layer in the wet processes such as wet cleans following etch. Recent advances in materials include forming low-k IMD layers using porogens by vapor deposition. After the deposition is complete, the porogens are removed with a cure process. The IMD layers are patterned into, for example, trenches, by etching. Wet processing is used to complete the IMD layers. If the IMD layer is not of sufficient mechanical strength, damage may occur to the IMD layer in the wet processes such as wet cleans following etch. While it is known that a longer cure of the IMD material can be beneficial in increased mechanical strength of the dielectric layers, increasing cure time also increases moisture absorption and creates lower throughput, increasing cost and reducing wafer yield per hour. Increased moisture absorption can result in blurred lines and distorted lines or loss of lines in the wet processes.

A continuing need thus exists for methods and apparatus for advanced low-k dielectric layers with high mechanical strength without the disadvantages currently experienced using the known methods.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
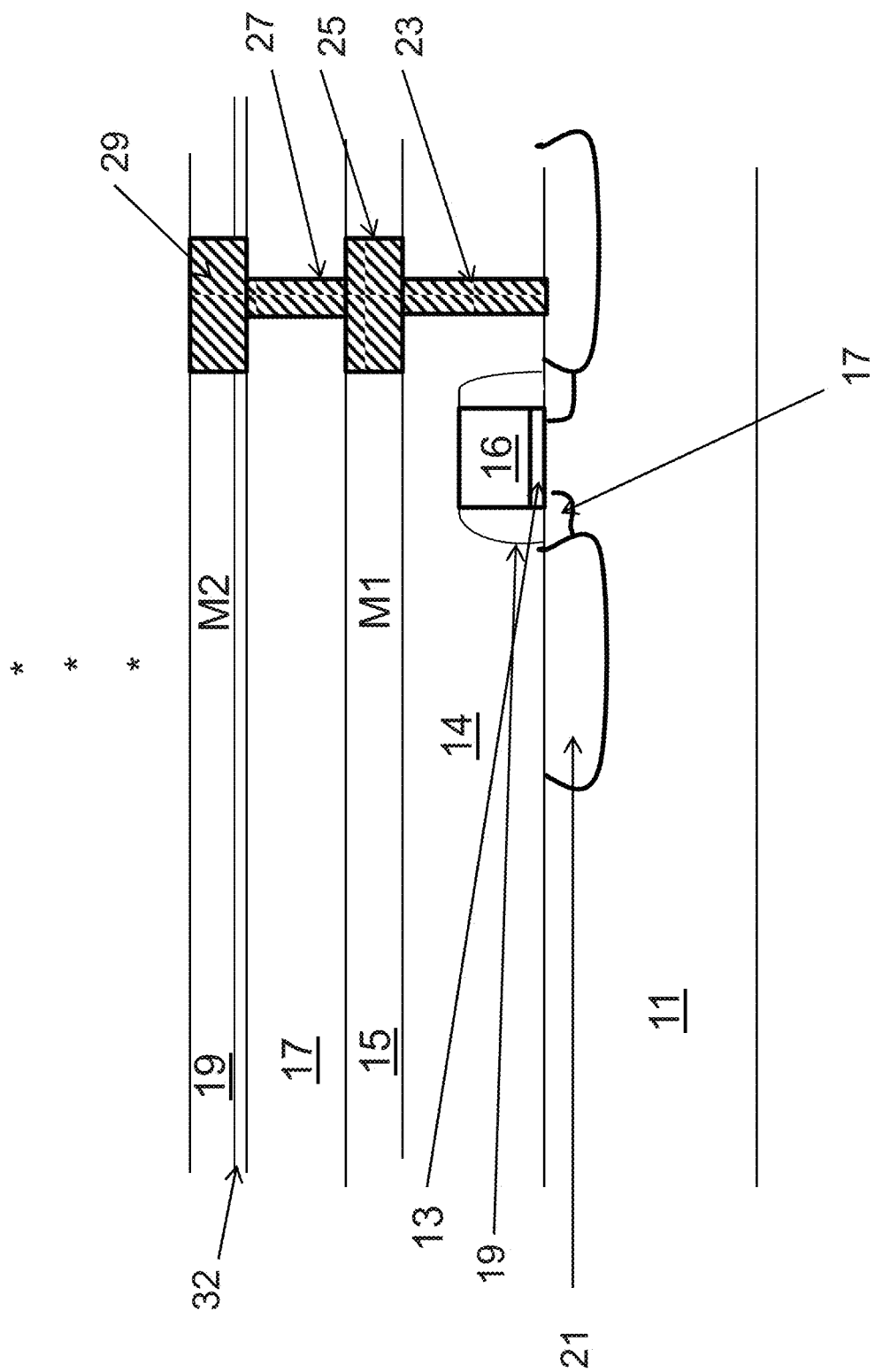
FIG. 1 depicts in a cross sectional view an integrated circuit structure at an intermediate process stage for illustrating the embodiments.

The drawings, schematics and diagrams are illustrative and not intended to be limiting, but are examples of embodiments of the invention, are simplified for explanatory purposes, and are not drawn to scale.

DETAILED DESCRIPTION

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present application, which are now described in detail, provide novel methods and apparatus for manufacturing semiconductor devices including forming low-k SiCOH dielectric films with porogens. These low k dielectric films may be used for, as an example, IMD or ILD in an integrated circuit. In the semiconductor processing art, as feature sizes continue to decrease with each generation or process node, RC delays and crosstalk associated with conductors or metallization layers have increased. These conductors may be formed in and are surrounded by dielectric materials. By lowering the dielectric constants in these dielectric materials, device performance can be improved. The dielectric material SiCOH is sometimes referred to as organosilicate glass or "OSG". This material may have a dielectric constant lower than that of $SiO_2$, or "oxide", which has a k constant of around 3.9-4.0. Because the dielectric constant is lower than oxide, the material is referred to as a "low-k" dielectric.

In some forms SiCOH may have a dielectric constant k of between about 2.7-3.0. However, the dielectric k constant can still be further lowered by the additional use of porogens. Porogens are sacrificial "pore generating" materials that are compatible with the dielectric materials, and are added to the film during the layer formation or afterwards. A curing step is then used to decompose and remove portions of the porogen material out of the film layer, causing pores. The pores lower the dielectric constant of the now porous SiCOH still further, and thus improve performance of the SiCOH material as a low-k dielectric. The k constant can now be lowered to <2.7 and can be made between 2.0-2.7, for example.

In an example embodiment, a layer of SiCOH dielectric used in forming an integrated circuit includes SiCOH deposited in a chemical vapor deposition chamber. Plasma enhanced CVD ("PECVD") equipment may be conveniently used for the deposition. In addition, a porogen is added as the layer forms. A cure is performed after deposition to remove at least some or all of the porogen. Removing the porogen forms pores in the dielectric film. Further cross-linking occurs in the dielectric layer. It has been discovered that if the process conditions during the layer deposition are changed to a new lowered ratio for the $SiCH_3/Si$—$O_{network}$ of the as deposited porous SiCOH, surprisingly, the increased cross-linking results in a mechanical strength of the finished IMD layer that is greatly increased over conventional films—without any increased cure time. In an alternative embodiment, unexpected results have been discovered when the process conditions are changed to a new lowered $SiCH_3/Si-O_{network}$ ratio as the film deposits that allow the mechanical strength to be maintained at prior levels with greatly unexpected reductions in cure time, enabling a great increase in wafer per hour ("WPH") throughput with no loss of mechanical strength in the IMD layers.

In another aspect of the embodiments, it has been surprisingly discovered that if the process conditions for the chemical vapor deposition for the IMD are changed and controlled in a certain manner, the $\Delta Si-O_{network}$ cross-linking in the IMD layer increases unexpectedly even if the cure time is kept to the conventional time. Thus, substantial increases in cross-linking can be accomplished by lowering the $SiCH_3/Si-O_{network}$ ratio during deposition to a new low ratio, and maintaining the low ratio during the film formation in a controlled manner without the need for any additional processing time, while maintaining wafer per hour throughput.

FIG. 1 depicts in a cross section an intermediate stage of a semiconductor device that is compatible with application of the embodiments. In FIG. 1, semiconductor substrate 11 is provided. The semiconductor substrate may be one of silicon or gallium arsenide for example, and may be doped slightly to provide an n or p type substrate for use in forming FET transistors or the like. The substrate may be a layer of epitaxial material grown on an insulator, such as SOI material. A gate dielectric layer 13 is formed over the semiconductor substrate 11 and a gate conductor 16 is formed over the gate dielectric. The gate conductor and gate dielectric elements are patterned together to form a gate electrode, for example, running into the page as shown in the cross section of FIG. 1. Lightly doped drain ("LDD") regions 17 are formed on either side of the gate electrode. This may be done by performing a self-aligned ion implantation using the gate electrode and dielectric layers as an implant mask. Sidewalls 19 are formed over the gate conductor 15. These may be silicon oxide, silicon nitride, of silicon oxynitride, for example. Additional dielectrics may be used for the sidewalls, and sacrificial sidewall materials may also be used. The source and drain regions 21 are formed in the substrate surface, again this may be done by an ion implantation step. The source and drain regions may be formed of p or n type conductivity by the selection of the appropriate dopant ions. Dopant ions may include boron, arsenic, phosphorous, and gallium, for example.

The gate conductor, gate dielectric, source and drain regions form a planar MOSFET transistor. This device may be of p or n conductivity type. Similar process steps could be used to form other or different devices such as diodes, or silicon controlled rectifiers, or capacitors, for example. ILD layer 14 is shown overlying the transistor structure. This layer will cover the gate conductor 16 and the source and drain regions 21, providing electrical insulation and setting up a surface for the first metallization layer to be formed above it. Contacts, such as 23, are vertical connections which may be made to the gate, source and drain regions for example. The contacts are etched through the ILD 14 and may expose portions of the source, drain and gate conductor regions. The contacts are then filled with conductor material or conductive plugs are used, and the connections extend vertically to the first metallization layer 15 to form an electrical connection to the gate, source and drain of the MOSFET transistor.

First metal conductor 25 is shown overlying the drain contact 23, for example. This first level metal or "M1" layer is formed from a single damascene copper or copper alloy or other conductor. The copper is electroplated into a trench etched within a dielectric layer 15. During electroplating the copper fills and then overfills the trench. Because chemical etchants and other etch processes are ineffective in patterning copper, a chemical mechanical polishing process is used with abrasive slurry and a pad to mechanically remove the excess copper. Inlaid conductor 25 is the result, formed within the trench and surrounded by the dielectric layer 15. Typically the trench is conformally lined on the sides and bottom with a diffusion barrier, such as tantalum. The upper surface of the copper conductor 25 may also have a film or barrier layer placed thereon (not shown).

Trench first or via first dual damascene processing is then used to form additional metallization layers over conductor 25 and the M1 layer. Advanced processes may have 5, 6, 8 or even more of such metallization layers. IMD layer 17 is formed of the porous SiCOH material using CVD in one alternative embodiment, or PECVD in another alternative embodiment. A cure is performed to drive out at least some and typically all of the porogen and form pores, lowering the dielectric constant. In one embodiment the porogen is a UV curable (UV decomposable) porogen. In another alternative embodiment the porogen may be thermally curable. The appropriate cure is then used. In then illustrations presented here for explanation, a UV curable porogen is used. The embodiments are not so limited, however.

After formation and cure, the IMD layer 17 is then covered by an etch stop layer 32 and another IMD layer 19 for use in a via first dual damascene CMP process. The vias 27 are formed using photoresist, patterning, and an anisotropic etch of the IMD layer. The etch may be performed, for example, using RIE processes. A wider PR pattern is formed and a second etch is done to etch the trench for the second metallization layer 29, which forms the M2 layer. Etch stop layer 32 may be a nitride such as $Si_3N_4$, or a carbon layer such as SiC or other etch stop layer, which may be used with a selective etchant to control the formation of the trench for conductor 29. Again a copper or other conductor electroplating is used, this time to fill via 27 and the "metal 2" trench, 29. CMP processing is again used to complete the inlaid metal 29 within the second metal layer, surrounded by IMD 19. This dual damascene process continues for each of the metallization layers. The IMD layers of the low k porous SiCOH dielectric provide electrical insulation for the conductors, and allow space for vertical connections between layers using vias. The metallization layers provide horizontal conductors to couple different portions of the circuit. Advanced integrated circuits include many thousands or more transistors and many layers of interconnect may be used to couple the transistors to form processors, memories, microcontrollers and the like.

So as seen in the discussion above, at several points in the semiconductor process, formation of dielectric films is performed. The dielectric films either separate (e.g. Intermetal layer dielectric or IMD) or include (metallization layer dielectrics, or interlevel dielectrics ILD) metal conductors. For these dielectric films, with advanced semiconductor process rules and continually decreasing dimensions, the dielectric constant k needs to be as low as possible—while still maintaining the mechanical strength needed to provide good line definition after wet processes such as cleaning and etching, for example, and having sufficient mechanical strength to withstand CMP processing. Line loss in patterned dielectric, and line distortion, have both been observed in low k films where the mechanical strength is not sufficient to withstand the wet processing. After etching a wet clean is typically performed and line blurring or distortions have been observed when the mechanical strength of the dielectric film is low.

SiCOH films are increasingly used for IMD and ILD dielectrics. These may be referred to as "organosilicate glass" films or "OSG". Sometimes additional materials such as F are also present in the dielectric film, these embodiments are alternatives to the example embodiments. In one example process, the porous OSG films may be deposited in a chemical vapor deposition chamber ("CVD"). An inert gas such as argon (Ar) or helium (He) is provided to the vapor deposition chamber which houses a wafer support or platen holding the wafer. Reactive gases are introduced into the chamber and used as sources for the film elements, for example, trimethyl silane $(CH_3)_3SiH$ or "TMS", and $CO_2$ as a carrier gas may be used as reactive gases. Other reactive gases are known for forming SiCOH films such as organosilanes and organosilaxanes. Chemical vapor deposition may be used, alternatively plasma enhanced chemical vapor deposition ("PECVD") may be used. Plasma energy is used to activate the formation of a film layer on the wafer substrate. A sacrificial porogen is also included. The porogen is an organic material and may be a cyclic hydrocarbon, for example, that decomposes during the cure cycle. UV curable porogens for organosilicate glass are known and commercially available. Thermal curable porogens are also known and also may be used. In an embodiment, a UV curable porogen is used. In an alternative embodiment, a thermally curable porogen may be used. A UV cure is able to remove the porogen on the substrate as does the thermal cure, the UV cure also contributes increased efficiency for porogen removal and better cross-linking. The porogens typically decompose in the initial portion of the cure time, and are removed from the dielectric material, leaving pores in the structure, which reduces the dielectric constant. In the examples presented below, which are not limiting on the embodiments but are used for illustrative purposes, a UV curable porogen compatible with OSG was selected.

In forming the SiCOH film, the dielectric constant k and the mechanical strength (measured as Young's Modulus, E, usually expressed in "Gpa" or gigapascals units) are important. Si—O bonds such as $\Delta Si—O_{network}$ are also important, as they are a form of cross-linking which increases mechanical strength in the low k dielectric film.

In a conventionally deposited porous SiCOH film known in the art, it is known that the mechanical strength can be increased by increasing the post deposition cure time. In an example, a UV decomposable porogen was used and UV cure time is increased form 300 seconds to 450 seconds. The mechanical strength increased following the much longer cure. While the mechanical strength is in fact increased with increasing cure time, this known approach has many disadvantages. The cost per wafer increases as the wafer per hour rate falls. For example, increasing the UV cure time by 50% from 300 s to 450 s will increase the mechanical strength—but this is a 50% increase in process time. This time becomes particularly significant because in a multiple metal layer process, as described above, the IMD films are used in each layer and so, increases in cure time are repeated several times per wafer.

Further an increase in dangling bonds has been observed with increased cure time. These dangling bonds make the film far more likely to absorb water. Water absorption is a significant problem because the resulting dielectric film will undergo wet etch/clean processes, and CMP polish processes, and even DI rinse processes that will expose the film to water. A dielectric with high likelihood of water absorption will suffer increased line blurring or other damage and reduce process yields. Another disadvantage of increasing UV cure time is that the increased cure time results in increased thermal effects and corresponding damage to devices.

The inventors of the present application have observed an unexpected phenomenon. If the conventional SiCOH deposition process is carefully controlled using a Fourier Transform Infrared ("FTIR") process monitor, for example, to form as-deposited SiCOH films with porogen materials that exhibit a ratio of the Si—$CH_3$ bonds to the Si—$O_{network}$ bonds that is far lower than the conventional film, the mechanical strength may be increased substantially. This increase is also achieved without changing the dielectric constant k and without an increase in cure time. Alternatively, if the mechanical hardness for a film is at an acceptable level, by changing the Si—$CH_3$/$SiO_{network}$ ratio and monitoring it carefully during deposition to form an as-deposited film with a new lowered Si—$CH_3$/$SiO_{network}$ ratio, the result is a process for forming a porous dielectric film with far lower cure time and with the same mechanical hardness and the same dielectric constant as the conventionally formed film, thus greatly increasing the wafer throughput without any costs. The key point is that the ratio of specific bonding types is more important than the chemical stoichiometric composition, due to the enhanced mechanical strength of the finished porous low-k dielectric film. No additional process steps or chemical materials are used with the embodiments; thus, use of the method embodiments have essentially no added cost over conventional processes—yet dramatically improve performance.

Figure 2:
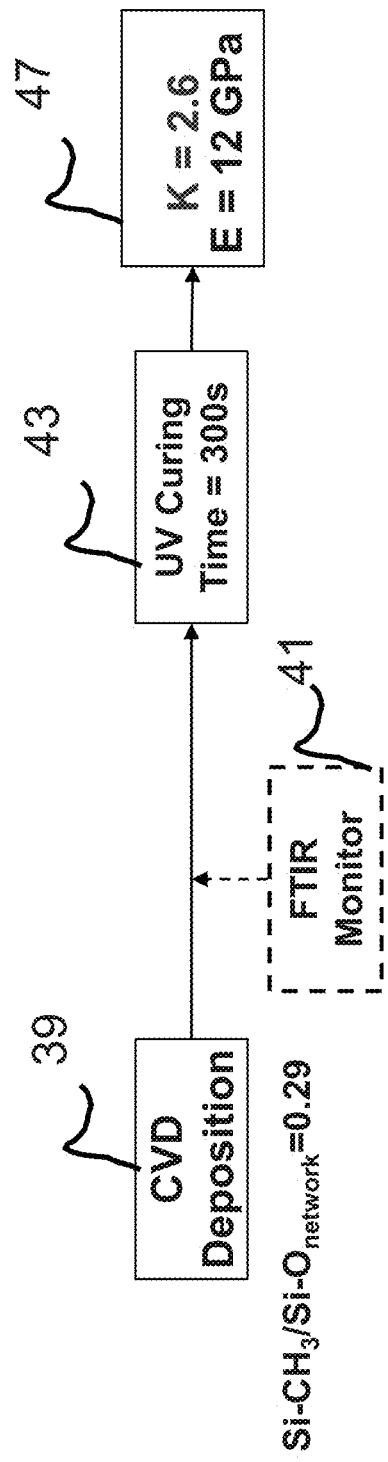
FIG. 2 depicts in a process flow a conventional CVD deposition process for forming a low k dielectric film.

FIG. 2 depicts in a flow diagram a typical process without use of the embodiments. This process is presented for explanatory purposes. In state 39 an example dielectric film is deposited by PECVD for example using a porogen. A FTIR monitor 41 is used to observe the film and in this typical conventional example, an as-deposited film having a $_{Si—CH3}$/$SiO_{network}$ ratio of 0.29 is formed by adjusting the gasses used during deposition. A UV cure of 300 seconds was then used to decompose the UV curable porogen and remove it from the film, forming a porous organosilicate glass film. After the processing the following measurements were observed: the material had a Young's Modulus E that was 12 Gpa and the dielectric constant k was 2.6.

A physical phenomenon that contributes to mechanical hardness is Si—O bonding and cross-linking. Surprisingly, the inventors have observed that when the Si—$CH_3$/$SiO_{network}$ ratio is lowered below about or equal to 0.25 in the as-deposited porous SiCOH during CVD deposition, the Si—O bonding and cross-linking dramatically increases.

This discovery led to the embodiments of the invention. The chart in FIG. 4 further illustrates the point. Data was taken for different sample films in semiconductor processing conditions for a PECVD chamber. The films were approximately 3500 Angstroms thick in the experiments; however, the film thicknesses formed will vary in a particular semiconductor process depending on the process node and the application. For example, ILD films may have different thicknesses than IMD films and the porous organosilicate glass films may be used in other applications; such as forming cap, adhesion layers, and barrier films. A range of thicknesses from 300-5000 Angstroms may be expected.

Figure 3:
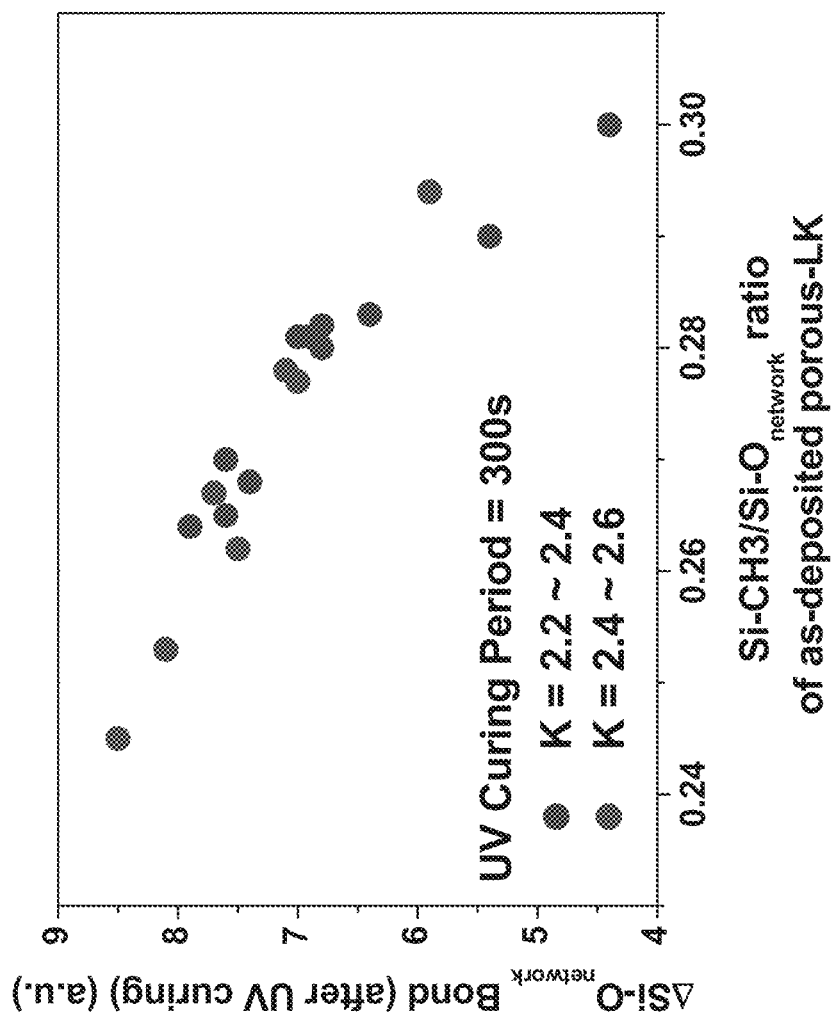
FIG. 3 depicts a graph of silicon-oxygen bonding in low k dielectric films having various $SiCH_3/Si$—$O_{network}$ ratios as deposited.

In FIG. 3, as the Si—$CH_3$/$SiO_{network}$ ratio is decreased to 0.25 and below, the $\Delta Si—O_{network}$ bonding (crosslinking) observed in the as-deposited film increased. Thus, it has been determined that there is an inverse relationship between the Si—$CH_3$/$SiO_{network}$ ratio in the as-deposited porous SiCOH film, and the amount of Si—O bonding. The increased crosslinking also will increase the mechanical strength of the material; one would also then expect to find a similar inverse relationship between the Si—$CH_3$/$SiO_{network}$ ratio and the mechanical strength of the resulting film.

Figure 4:
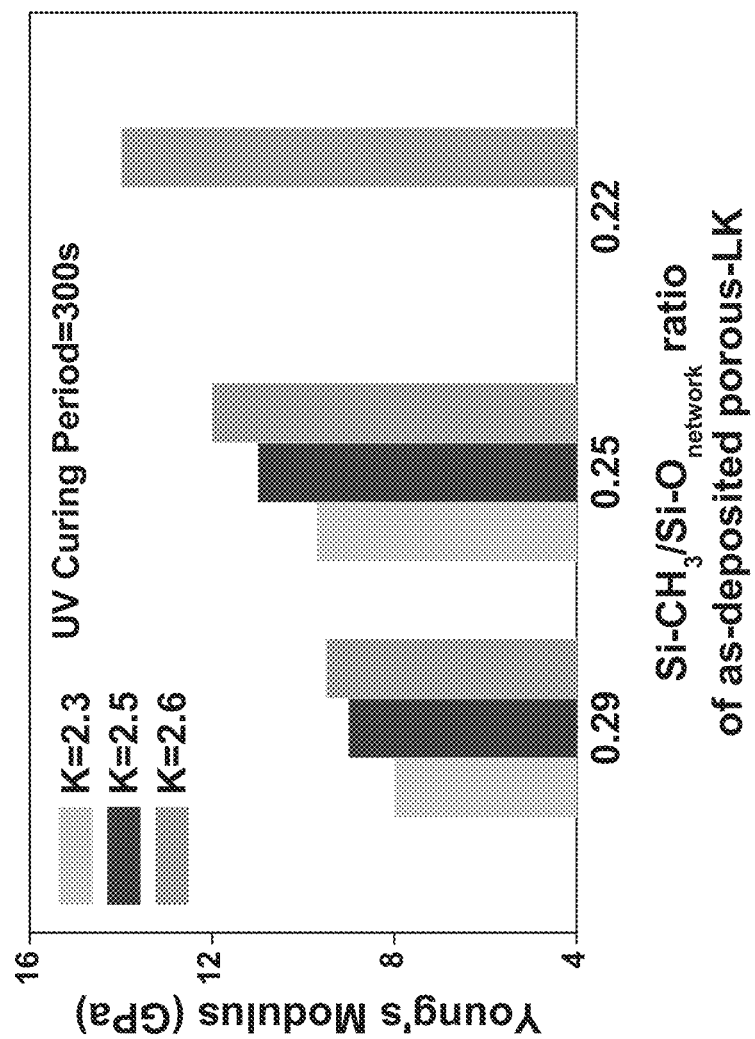
FIG. 4 depicts in a bar graph the Young's Modulus obtained for films using the conventional deposition and the embodiments for different dielectric constants.

FIG. 4 depicts observations made confirming the relationship. The mechanical strength measured for the embodiments when the Si—$CH_3$/$SiO_{network}$ ratio is less than 0.25 in the as deposited film increases substantially over the prior approach when the other variables (cure time, primarily) are kept the same. Thus, it has been surprisingly observed that by monitoring the deposition process to maintain the Si—$CH_3$/$SiO_{network}$ at a level of about or less than about 0.25 during CVD for a porous SiCOH film, the mechanical strength of the resulting layer can be substantially increased at no cost in throughput time, and at no additional cost in materials or otherwise.

Figure 5:
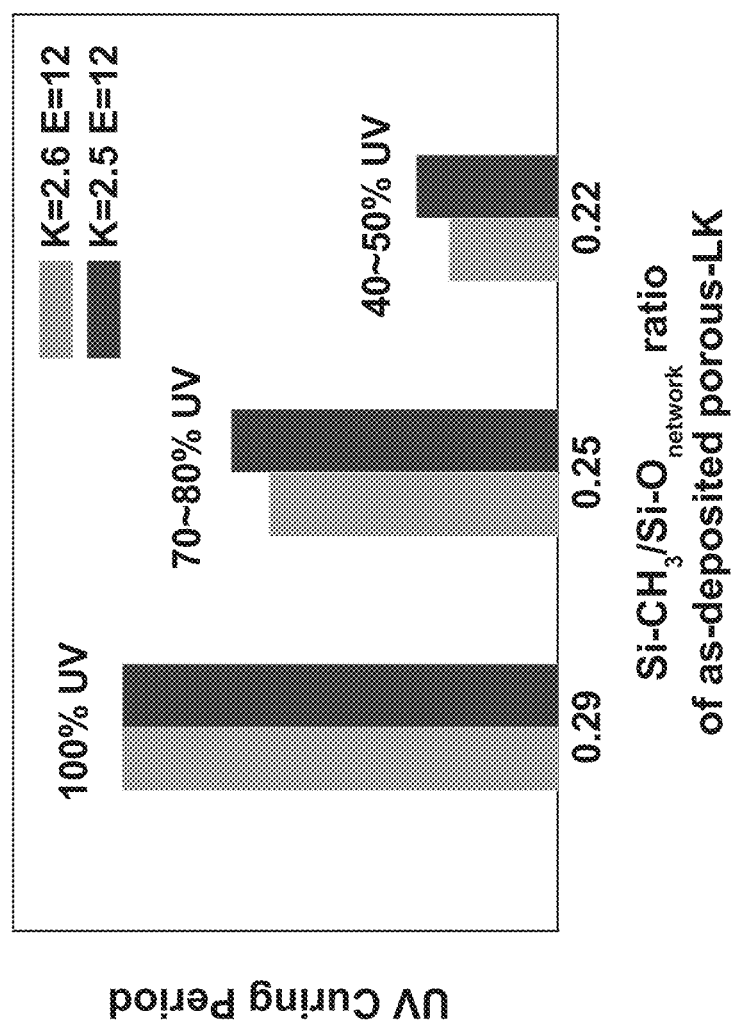
FIG. 5 depicts in a bar graph the UV curing time obtained for a conventional film deposition and for films deposited with the embodiments.

Another aspect of the embodiments is illustrated in FIG. 5. If an adequate mechanical strength for a given layer is obtained using conventional known approaches, then it has been surprisingly discovered that without changing the dielectric constant k, the cure time for the film can be substantially reduced by reducing the Si—$CH_3$/$SiO_{network}$ ratio to about or less than 0.25 in the as deposited film. FIG. 5 depicts the results of experiments performed again on a porous SiCOH film formed in a PECVD chamber. The conventional approach with an as-deposited Si—$CH_3$/$SiO_{network}$ ratio of about 0.29 resulted in a mechanical strength E of about 12 GPa for a cure time of 300 seconds. By reducing the Si—$CH_3$/$SiO_{network}$ ratio substantially, it has been discovered that the cure time can be substantially reduced and without any loss of performance. If the Si—$CH_3$/$SiO_{network}$ ratio is reduced in the as-deposited film to 0.22, then the cure time can be reduced by as much as 40-50%. This greatly increases wafer throughput because, as pointed out above, the UV cure step will be performed for each of the IMD layers, and there are several layers of dielectric film that may be formed with the porous SiCOH material in a semiconductor process, so the reduced cure time is realized at multiple times in the process. No added cost is entailed in using the embodiments; thus, the cost per wafer (or, increased yield) is improved.

Figure 6:
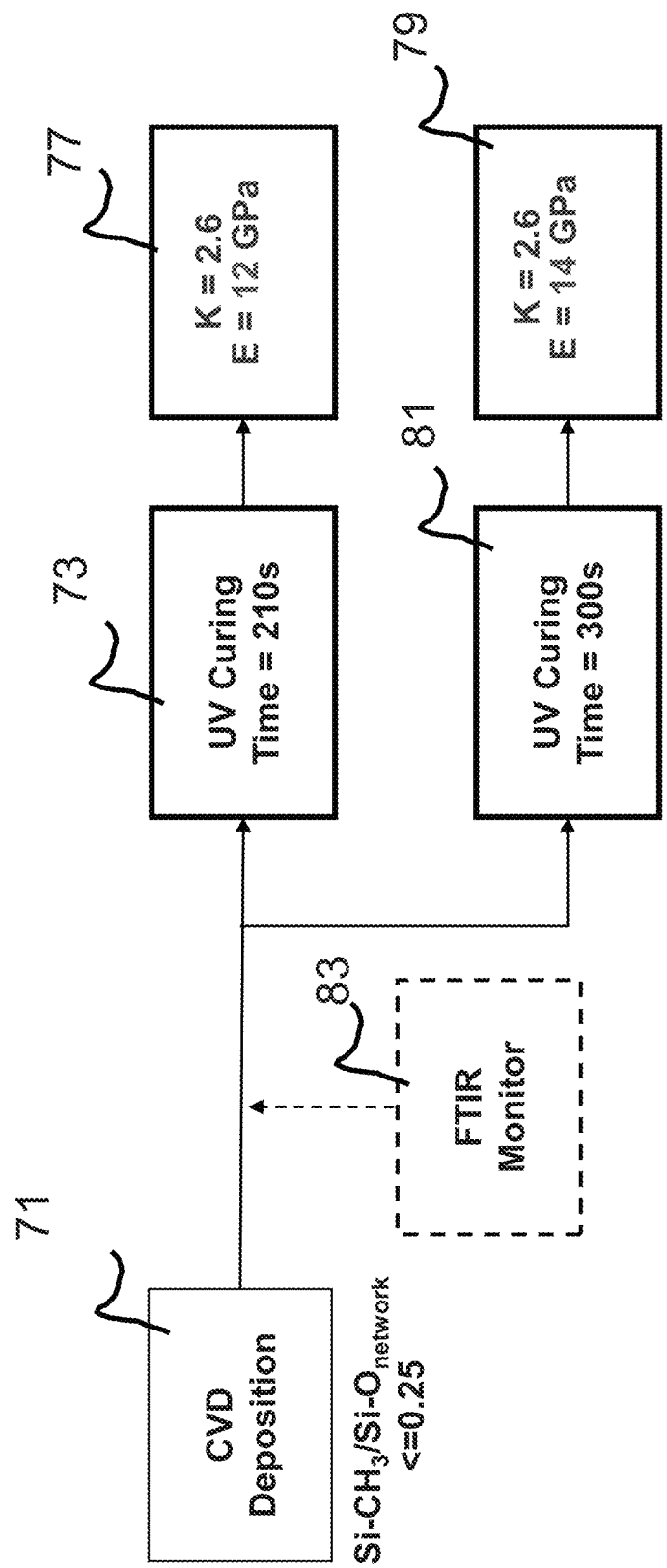
FIG. 6 depicts in a process flow diagram two alternative flows for forming low k dielectric films using the embodiments.

FIG. 6 depicts in a process flow diagram the two alternative method embodiments described above. In step 71, the CVD deposition is first performed for the SiCOH film including a porogen. The Si—$CH_3$/$SiO_{network}$ ratio is monitored throughout the process and kept below 0.25 or equal to 0.25. After deposition, two possible alternatives are considered. If the primary goal is to reduce cure time without a reduction in material strength or change in dielectric constant k (compared to conventional materials), the process of step 73 is performed, the UV curing time is reduced substantially. In step 77 the material properties obtained are shown, the Young's Modulus is still 12 GPa, as strong as for the material formed in the conventional processes, and the dielectric constant is till 2.6; that is no loss of performance occurred. This is in spite of the greatly reduced curing time.

However if the primary concern is that the material have greater mechanical strength than the films obtained in the conventional processes, the process of step 81 is performed, which uses the same curing time, 300 seconds in this example, as the conventional process. Now, however, the film has an as-deposited Si—$CH_3$/$SiO_{network}$ ratio of 0.25 or less. The material properties can then be seen as measured in step 79; the Young's Modulus value is increased to 14 GPa, while the dielectric constant remains the same as before, 2.6, so no loss of performance was noted and in fact the increase in material strength was obtained at no cost in terms of process time, no added steps, or added materials.

Example results are as follows: For a porous low k dielectric film using the conventional Si—$CH_3$/$SiO_{network}$ ratio of 0.29, a UV cure time of 300 seconds, the resulting film had a Young's Modulus of 8 GPa and a dielectric constant k of 2.3. Using the embodiment Si—$CH_3$/$SiO_{network}$ ratio of 0.25 in depositing the porous low k film as described above, with the same UV cure time of 300 seconds, the dielectric film has a mechanical strength with a Young's Modulus of 9.7 Gpa, and the same dielectric constant k of 2.3. For a porous low k film with a dielectric constant k of 2.6 and deposited using the conventional approach with a Si—$CH_3$/$SiO_{network}$ ratio of 0.29 and a UV cure time of 450 seconds, the resulting dielectric film has a mechanical strength with a Young's Modulus of 12 Gpa. Using the embodiments described above to deposit a porous low k dielectric film with a Si—$CH_3$/$SiO_{network}$ ratio as deposited of 0.22, and a UV cure time of only 210 s, less than 50% of the conventional cure time, the resulting dielectric film has a mechanical strength with a Young's Modulus of 12 GPa.

In an embodiment, a method is provided including placing a semiconductor substrate into a vapor deposition chamber; introducing reactive gases into the vapor deposition chamber to form a dielectric film comprising SiCOH and a decomposable porogen; depositing the dielectric film to have a ratio of Si—$CH_3$/$SiO_{network}$ of less than or equal to 0.25; and performing a cure for a cure time to remove substantially all of the porogen from the dielectric film. In a further embodiment of the above method the porogen includes a cyclic hydrocarbon. In an alternative embodiment the porogen is UV curable. In another embodiment the method of performing the cure includes exposing the dielectric film to a UV light source for the cure time. In another embodiment, the above method is performed wherein the porogen is thermally curable.

In a further embodiment of the above methods, the dielectric film has a Young's Modulus of greater than 10 gigapascals. In another embodiment of the above methods, the ratio of Si—$CH_3$/$SiO_{network}$ in the as deposited dielectric film is less than 0.24. In still another embodiment of the method, the ratio of Si—$CH_3$/$SiO_{network}$ in the dielectric film is equal to 0.22. In an alternative embodiment, the cure time is less than or equal to 300 seconds. In a further embodiment of the above method, a first initial cure time is determined for a dielectric film of SiCOH and the porogen deposited with a Si—$CH_3$/$SiO_{network}$ ratio of greater than 0.26 and having a desired mechanical strength measured as a desired Young's Modulus; and the cure time of the dielectric film formed using the Si—$CH_3$/$SiO_{network}$ ratio of less than or equal to 0.25 is set to less than 70% of the first initial cure time; the resulting dielectric film having the desired Young's Modulus. In still another embodiment of this method, the cure time of the dielectric film formed using the Si—$CH_3$/$SiO_{network}$ ratio of less than or equal to 0.25 is less than or equal to 50% of the first initial cure time, the resulting dielectric film having the desired Young's Modulus.

In another alternative method embodiment, at least one active device is formed on a surface of a semiconductor substrate; and a plurality of layers of metal conductors are formed over the semiconductor substrate, the layers of metal conductors separated by intermetal dielectric layers. In this method each of the intermetal dielectric layers are formed by placing the semiconductor substrate into a vapor deposition chamber; introducing reactive gases into the vapor deposition chamber to form a dielectric film comprising at least SiCOH and a decomposable porogen; depositing the dielectric film to have an as-deposited ratio of Si—$CH_3$/$SiO_{network}$ of less than or equal to 0.25; and performing a cure for a cure time to remove substantially all of the porogen from the dielectric film. In another alternative embodiment, the dielectric film is deposited with a Si—$CH_3$/$SiO_{network}$ ratio of less than 0.24. In another alternative, the dielectric film has a Young's Modulus mechanical strength of greater than 10 gigapascals. In still another alternative the dielectric film has a Young's Modulus mechanical strength of greater than 12 gigapascals. In yet another alternative embodiment of the above methods the porogen is UV curable and performing a cure further includes exposing the dielectric film to a UV light source for the cure time. In a further embodiment the cure time is less than 300 seconds.

In an apparatus embodiment, at least one active device is formed on a surface of a semiconductor substrate; and a plurality of layers of metal conductors are formed over the surface of the semiconductor substrate, the layers of metal conductors separated by intermetal dielectric layers, each of the intermetal dielectric layers comprising a porous SiCOH dielectric film having an as deposited Si—$CH_3$/$SiO_{network}$ ratio of less than or equal to 0.25. In an alternative embodiment, the as deposited Si—$CH_3$/$SiO_{network}$ ratio of the porous SiCOH dielectric film is less than or equal to 0.22. In still a further alternative embodiment, the porous SiCOH dielectric film has a mechanical strength with a Young's Modulus greater than or equal to 12 gigapascals.

According to an embodiment, a semiconductor device comprises a substrate, and a porous dielectric film over the substrate, the porous dielectric film having a Si—$CH_3$/$SiO_{network}$ ratio of less than or equal to 0.25, the porous dielectric film comprising at least a single carbon (C) atom, wherein the Si—$CH_3$/$SiO_{network}$ ratio is a ratio of Si—$CH_3$ bonds and $SiO_{network}$ bonds.

According to another embodiment, a semiconductor device comprises a substrate, at least one active device on a surface of the substrate, and a plurality of layers of metal conductors over the substrate, the layers of metal conductors being separated by intermetal dielectric layers, wherein each of the intermetal dielectric layers has a Si—$CH_3$/$SiO_{network}$ ratio of more than zero but less than or equal to 0.25, the Si—$CH_3$/$SiO_{network}$ ratio being a ratio of Si—$CH_3$ bonds and $SiO_{network}$ bonds.

According to yet another embodiment, a semiconductor device comprises a substrate, a porous dielectric layer over the substrate, the porous dielectric layer having a first Si—$CH_3$/$SiO_{network}$ ratio of less than or equal to 0.25, the porous dielectric layer comprising at least a single Si—$CH_3$ bond, wherein the first Si—$CH_3$/$SiO_{network}$ ratio is a ratio of Si—$CH_3$ bonds and $SiO_{network}$ bonds, and layers of metal conductors over the porous dielectric layer, the layers of metal conductors being separated by intermetal dielectric layers.

The scope of the present application is not intended to be limited to the particular illustrative embodiments of the structures, methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. A semiconductor device comprising:
   a substrate; and
   a porous dielectric film over the substrate, the porous dielectric film having a Si—$CH_3$/$SiO_{network}$ ratio of less than or equal to 0.25, the porous dielectric film comprising at least a single carbon (C) atom, wherein the Si—$CH_3$/$SiO_{network}$ ratio is a ratio of Si—$CH_3$ bonds and $SiO_{network}$ bonds.

2. The semiconductor device of claim 1, wherein the porous dielectric film has a Young's Modulus greater than 10 gigapascals.

3. The semiconductor device of claim 1, wherein the porous dielectric film has a thickness between about 300 Å and about 5000 Å.

4. The semiconductor device of claim 1, wherein the porous dielectric film has the Si—$CH_3$/$SiO_{network}$ ratio less than about 0.24.

5. The semiconductor device of claim 1, wherein the porous dielectric film has the Si—$CH_3$/$SiO_{network}$ ratio equal to about 0.22.

6. The semiconductor device of claim 1, wherein the porous dielectric film comprises SiCOH.

7. The semiconductor device of claim 1, wherein the porous dielectric film has a dielectric constant less than about 2.6.

8. A semiconductor device comprising:
   a substrate;
   at least one active device on a surface of the substrate; and
   a plurality of layers of metal conductors over the substrate, the layers of metal conductors being separated by intermetal dielectric layers, wherein each of the intermetal dielectric layers has a Si—$CH_3$/$SiO_{network}$ ratio of more than zero but less than or equal to 0.25, the Si—$CH_3$/$SiO_{network}$ ratio being a ratio of Si—$CH_3$ bonds and $SiO_{network}$ bonds.

9. The semiconductor device of claim 8, wherein a first dielectric layer of the intermetal dielectric layers has a Young's Modulus greater than 12 gigapascals.

10. The semiconductor device of claim 8, wherein a first dielectric layer of the intermetal dielectric layers has a thickness between about 300 Å and about 5000 Å.

11. The semiconductor device of claim 8, wherein a first dielectric layer of the intermetal dielectric layers has at least one pore.

12. The semiconductor device of claim 11, wherein a second dielectric layer of the intermetal dielectric layers has a plurality of pores.

13. The semiconductor device of claim 8, wherein a first dielectric layer of the intermetal dielectric layers has a dielectric constant between about 2.2 and about 2.6.

14. The semiconductor device of claim 8, wherein a first dielectric layer of the intermetal dielectric layers comprises SiCOH.

15. A semiconductor device comprising:
    a substrate;
    a porous dielectric layer over the substrate, the porous dielectric layer having a first Si—$CH_3$/$SiO_{network}$ ratio of less than or equal to 0.25, the porous dielectric layer comprising at least a single Si—$CH_3$ bond, wherein the first Si—$CH_3$/$SiO_{network}$ ratio is a ratio of Si—$CH_3$ bonds and $SiO_{network}$ bonds; and
    layers of metal conductors over the porous dielectric layer, the layers of metal conductors being separated by intermetal dielectric layers.

16. The semiconductor device of claim 15, wherein a first dielectric layer of the intermetal dielectric layers has a second Si—$CH_3$/$SiO_{network}$ ratio of less than or equal to 0.25.

17. The semiconductor device of claim 16, wherein the first dielectric layer of the intermetal dielectric layers has a thickness between about 300 Å and about 5000 Å.

18. The semiconductor device of claim 16, wherein the first dielectric layer of the intermetal dielectric layers has at least one pore.

19. The semiconductor device of claim 15, wherein the porous dielectric layer comprises organosilicate glass (OSG).

20. The semiconductor device of claim 15, wherein the porous dielectric layers has a Young's Modulus between about 9.7 gigapascals and about 14 gigapascals.

\* \* \* \* \*